United States Patent
He et al.

(10) Patent No.: US 11,876,513 B1
(45) Date of Patent: Jan. 16, 2024

(54) LOW POWER CONSUMPTION BOOST CIRCUIT FOR PROVIDING HIGH DRIVING VOLTAGE OF TOUCH CIRCUIT

(71) Applicant: HIMAX TECHNOLOGIES LIMITED, Tainan (TW)

(72) Inventors: Jia-Ming He, Tainan (TW); Yaw-Guang Chang, Tainan (TW); Zong-You Hou, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 18/167,876

(22) Filed: Feb. 12, 2023

(51) Int. Cl.
| H03K 17/96 | (2006.01) |
| H02M 3/07 | (2006.01) |
| G06F 3/041 | (2006.01) |
| H02M 1/00 | (2006.01) |
| H03M 1/66 | (2006.01) |

(52) U.S. Cl.
CPC ......... H03K 17/962 (2013.01); G06F 3/0416 (2013.01); H02M 1/0045 (2021.05); H02M 3/07 (2013.01); *H03M 1/66* (2013.01)

(58) Field of Classification Search
CPC .. H03K 17/962; G06F 3/0416; H02M 1/0045; H02M 3/07; H03M 1/66
See application file for complete search history.

(56) References Cited

U.S. PATENT DOCUMENTS

| 2014/0375595 A1* | 12/2014 | Lin | G06F 3/0446 |
| | | | 345/174 |
| 2017/0336888 A1* | 11/2017 | Wang | G06F 3/04182 |
| 2017/0370976 A1* | 12/2017 | Lin | G01D 5/24 |
| 2018/0059868 A1* | 3/2018 | Brahma | G09G 3/2022 |
| 2018/0088735 A1* | 3/2018 | Lin | G06F 3/044 |

* cited by examiner

Primary Examiner — Muhammad N Edun
(74) Attorney, Agent, or Firm — CKC & Partners Co., LLC

(57) ABSTRACT

A low power consumption boost circuit for providing high driving voltage of a touch circuit is provided. The low power consumption boost circuit includes a charge pump circuit, two digital-to-analog converters (DACs), and a switch circuit. The charge pump circuit receives a system voltage and correspondingly outputs a positive output voltage twice the system voltage and a negative output voltage with opposite polarity as the system voltage. One of the DACs receives the positive output voltage from the charge pump circuit as supply voltage, and the other DAC receives the negative output voltage from the charge pump circuit as supply voltage. The switch circuit is connected between the DACs and the touch circuit. The DACs are connected between the charge pump circuit and the switch circuit. The DACs are alternately connected to the touch circuit by controlling the switch circuit, thereby driving the touch circuit alternately.

20 Claims, 7 Drawing Sheets

LOW POWER CONSUMPTION BOOST CIRCUIT FOR PROVIDING HIGH DRIVING VOLTAGE OF TOUCH CIRCUIT

BACKGROUND

Field of Invention

The present invention relates to a boost circuit. More particularly, the present invention relates to a low power consumption boost circuit for providing high driving voltage of a touch circuit.

Description of Related Art

The mobile phones are designed to be thinner, such that the distance between the touch panel and the display panel is getting closer, and thus the parasitic capacitance driven by the touch circuit is also increasing. This phenomenon is more serious when using the flexible AMOLED (Active-matrix organic light-emitting diode) panel in the folding mobile phones. Therefore, when the touch panel and the display panel are switched, a lot of noise interference will be introduced. In order to resist the noise interference, the strength of the signal for driving the touch circuit can be increased. However, if the touch circuit is driven by high driving voltage, the touch circuit will consume more power.

SUMMARY

The present invention provides a low power consumption boost circuit for providing high driving voltage of a touch circuit. The low power consumption boost circuit includes a charge pump, a first digital-to-analog converter (DAC), a second DAC, a first switch, and a second switch. The charge pump circuit includes an input terminal, a positive output terminal, and a negative output terminal. The input terminal receives a system voltage. The positive output terminal outputs a positive output voltage twice the system voltage. The negative output terminal outputs a negative output voltage with opposite polarity as the system voltage. The positive output terminal and a ground terminal are connected to the first DAC to supply power to the first DAC. The negative output terminal is connected to the second DAC to supply power to the second DAC. The first switch is connected between the first DAC and the touch circuit. The first DAC is connected between the charge pump circuit and the first switch. The second switch is connected between the second DAC and the touch circuit. The second DAC is connected between the charge pump circuit and the second switch. The touch circuit is alternately driven through the first DAC and the second DAC by controlling the first switch and the second switch to switch on alternately.

In accordance with one or more embodiments of the invention, the low power consumption boost circuit further includes a first low dropout regulator (LDO) and a second LDO. The first LDO is connected between the first DAC and the positive output terminal. The first LDO receives the positive output voltage from the positive output terminal to regulate the positive output voltage, thereby providing the regulated positive output voltage to the first DAC as supply power. The second LDO is connected between the second DAC and the negative output terminal. The second LDO receives the negative output voltage from the negative output terminal to regulate the negative output voltage, thereby providing the regulated negative output voltage to the second DAC as supply power.

In accordance with one or more embodiments of the invention, the negative output terminal and the ground terminal are connected to the second DAC to supply power to the second DAC. An absolute value of the negative output voltage is equal to an absolute value of the positive output voltage. The first DAC provides voltage from a ground voltage to a first positive voltage. The second DAC provides voltage from a first negative voltage to the ground voltage. The first positive voltage is equal to or less than the positive output voltage. The first negative voltage is equal to or greater than the negative output voltage.

In accordance with one or more embodiments of the invention, when the touch circuit is driven from the first negative voltage to the ground voltage, the second switch is controlled to switch on and the first switch is controlled to switch off, such that the touch circuit is powered by the ground voltage provided by the second DAC with zero power consumption.

In accordance with one or more embodiments of the invention, when the touch circuit is driven from the ground voltage to the first positive voltage, the first switch is controlled to switch on and the second switch is controlled to switch off, such that the touch circuit is powered by the first positive voltage provided by the first DAC.

In accordance with one or more embodiments of the invention, when the touch circuit is driven from the first positive voltage to the ground voltage, the first switch is controlled to switch on and the second switch is controlled to switch off, such that the touch circuit is powered by the ground voltage provided by the first DAC with zero power consumption.

In accordance with one or more embodiments of the invention, when the touch circuit is driven from the ground voltage to the first negative voltage, the second switch is controlled to switch on and the first switch is controlled to switch off, such that the touch circuit is powered by the first negative voltage provided by the second DAC.

In accordance with one or more embodiments of the invention, the low power consumption boost circuit further includes a third LDO connected to the second DAC. The third LDO receives the system voltage to regulate the system voltage, thereby providing the regulated system voltage to the second DAC as supply power.

In accordance with one or more embodiments of the invention, the input terminal and the negative output terminal are connected to the second DAC to supply power to the second DAC. An absolute value of the negative output voltage is equal to an absolute value of the system voltage. The first DAC provides voltage from a ground voltage to a first positive voltage. The second DAC provides voltage from a second negative voltage to a second positive voltage. The first positive voltage is twice the second positive voltage. The first positive voltage is equal to or less than the positive output voltage. The second positive voltage is equal to or less than the system voltage. The second negative voltage is equal to or greater than the negative output voltage.

In accordance with one or more embodiments of the invention, when the touch circuit is driven from the second negative voltage to the second positive voltage, the second switch is controlled to switch on and the first switch is controlled to switch off, such that the touch circuit is powered by the second positive voltage provided by the second DAC.

In accordance with one or more embodiments of the invention, when the touch circuit is driven from the second positive voltage to the first positive voltage, the first switch is controlled to switch on and the second switch is controlled to switch off, such that the touch circuit is powered by the first positive voltage provided by the first DAC.

In accordance with one or more embodiments of the invention, when the touch circuit is driven from the first positive voltage to the ground voltage, the first switch is controlled to switch on and the second switch is controlled to switch off, such that the touch circuit is powered by the ground voltage provided by the first DAC with zero power consumption.

In accordance with one or more embodiments of the invention, when the touch circuit is driven from the ground voltage to the second negative voltage, the second switch is controlled to switch on and the first switch is controlled to switch off, such that the touch circuit is powered by the second negative voltage provided by the second DAC.

In accordance with one or more embodiments of the invention, the low power consumption boost circuit further includes a third DAC and a third switch. The input terminal and the ground terminal are connected to the third DAC to supply power to the third DAC. The ground terminal and the negative output terminal are connected to the second DAC to supply power to the second DAC. An absolute value of the negative output voltage is equal to an absolute value of the system voltage. The third switch is connected between the third DAC and the touch circuit. The third DAC is connected between the charge pump circuit and the third switch. The touch circuit is alternately driven through the first DAC, the second DAC and the third DAC by controlling the first switch, the second switch and the third switch to switch on alternately.

In accordance with one or more embodiments of the invention, the first DAC provides voltage from a ground voltage to a first positive voltage. The second DAC provides voltage from a second negative voltage to the ground voltage. The third DAC provides voltage from the ground voltage to the second positive voltage. The first positive voltage is twice the second positive voltage. The first positive voltage is equal to or less than the positive output voltage. The second positive voltage is equal to or less than the system voltage. The second negative voltage is equal to or greater than the negative output voltage.

In accordance with one or more embodiments of the invention, when the touch circuit is driven from the second negative voltage to the ground voltage, the second switch is controlled to switch on and the first switch and the third switch are controlled to switch off, such that the touch circuit is powered by the ground voltage provided by the second DAC with zero power consumption.

In accordance with one or more embodiments of the invention, when the touch circuit is driven from the ground voltage to the second positive voltage, the third switch is controlled to switch on and the first switch and the second switch are controlled to switch off, such that the touch circuit is powered by the second positive voltage provided by the third DAC.

In accordance with one or more embodiments of the invention, when the touch circuit is driven from the second positive voltage to the first positive voltage, the first switch is controlled to switch on and the second switch and the third switch are controlled to switch off, such that the touch circuit is powered by the first positive voltage provided by the first DAC.

In accordance with one or more embodiments of the invention, when the touch circuit is driven from the first positive voltage to the ground voltage, the first switch is controlled to switch on and the second switch and the third switch are controlled to switch off, such that the touch circuit is powered by the ground voltage provided by the first DAC with zero power consumption. When the touch circuit is driven from the ground voltage to the second negative voltage, the second switch is controlled to switch on and the first switch and the third switch are controlled to switch off, such that the touch circuit is powered by the second negative voltage provided by the second DAC.

The present invention provides a low power consumption boost circuit for providing high driving voltage of a touch circuit. The low power consumption boost circuit includes a charge pump, two digital-to-analog converters (DACs), and a switch circuit. The charge pump circuit receives a system voltage and correspondingly outputs a positive output voltage twice the system voltage and a negative output voltage with opposite polarity as the system voltage. The said two DACs are connected to the charge pump circuit. One of the DACs receives the positive output voltage from the charge pump circuit as supply voltage, and the other DAC receives the negative output voltage from the charge pump circuit as supply voltage. The switch circuit is connected between the DACs and the touch circuit. The DACs are connected between the charge pump circuit and the switch circuit. The DACs are alternately connected to the touch circuit by controlling the switch circuit, thereby driving the touch circuit alternately.

In order to let above mention of the present invention and other objects, features, advantages, and embodiments of the present invention to be more easily understood, the description of the accompanying drawing as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Specific embodiments of the present invention are further described in detail below with reference to the accompanying drawings, however, the embodiments described are not intended to limit the present invention and it is not intended for the description of operation to limit the order of implementation. The using of "first", "second", "third", etc. in the specification should be understood for identify units or data described by the same terminology, but are not referred to particular order or sequence.

Figure 1:
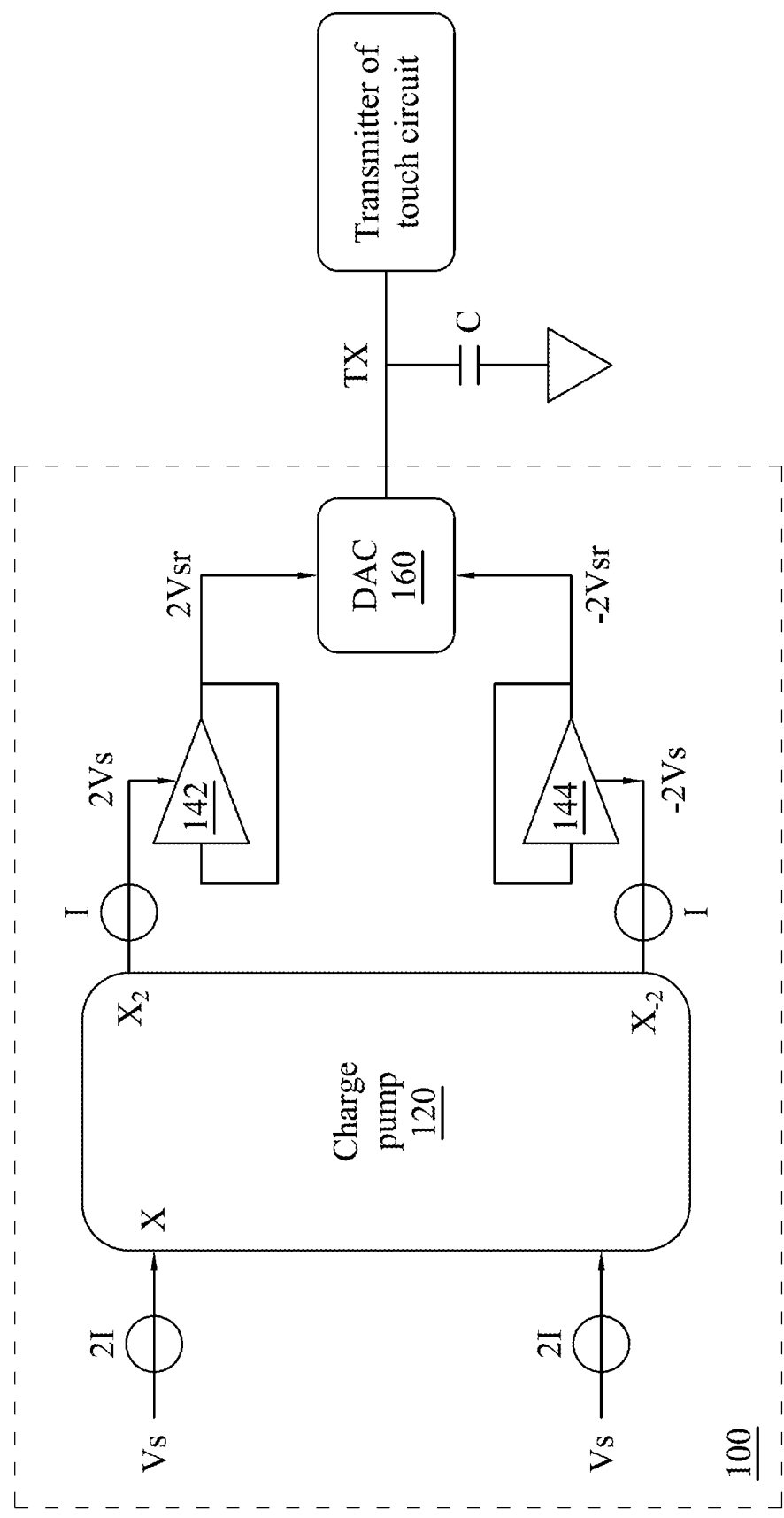
FIG. 1 illustrates a boost circuit for providing high driving voltage of touch circuit of the prior art.

FIG. 1 illustrates a boost circuit 100 for providing high driving voltage of touch circuit of the prior art. The boost circuit 100 includes a charge pump circuit 120, a first low dropout regulator (LDO) 142, a second LDO 144, and a digital-to-analog converter (DAC) 160.

The charge pump circuit 120 includes an input terminal X, a positive output terminal $X_2$, and a negative output terminal $X_{-2}$. The input terminal X receives a system voltage Vs (e.g., 3.3V). The positive output terminal $X_2$ outputs a positive output voltage 2Vs (e.g., 6.6V). The negative output terminal $X_{-2}$ outputs a negative output voltage −2Vs (e.g., −6.6V). Specifically, the charge pump circuit 120 receives the system voltage Vs and correspondingly outputs the positive output voltage 2Vs and a negative output voltage −2Vs. In other words, the positive and the negative output terminals respectively output the positive and the negative output voltages whose absolute voltage values have two times of the voltage values of the system voltage.

The first LDO 142 is connected between the DAC 160 and the positive output terminal $X_2$ of the charge pump circuit 120. The first LDO 142 receives the positive output voltage 2Vs from the charge pump circuit 120 so as to regulate the positive output voltage 2Vs, thereby providing the regulated positive output voltage 2Vsr (e.g., 6V) to the DAC 160 as the positive supply voltage of the DAC 160. The second LDO 144 is connected between the DAC 160 and the negative output terminal $X_{-2}$ of the charge pump circuit 120. The second LDO 144 receives the negative output voltage −2Vs from the charge pump circuit 120 so as to regulate the negative output voltage −2Vs, thereby providing the regulated negative output voltage −2Vsr (e.g., −6V) to the DAC 160 as the negative supply voltage of the DAC 160.

The DAC 160 is used to generate the transmitter signal TX to the transmitter of the touch circuit, thereby driving the touch circuit. Specifically, when the touch circuit is driven, the transmitter signal TX is required to charge the transmitter capacitor C (i.e., $C_{TX}$). Since the DAC 160 is powered by the regulated positive output voltage 2Vsr and the regulated negative output voltage −2Vsr, the TX signal generated by the DAC 160 can provide a high driving voltage from the regulated positive output voltage 2Vsr to the regulated negative output voltage −2Vsr.

For example, when the touch circuit is driven and a driven voltage of the TX signal is rising from −6V (the regulated negative output voltage −2Vsr) to 6V (the regulated positive output voltage 2Vsr), the charging current I of the transmitter capacitor C is supplied by the positive output terminal $X_2$ (i.e., the current I), and the system voltage Vs is correspondingly required to provide the current 2I, and thus the power consumption is 6*2*2I*C=24*I*C. Similarly, when the driven voltage of the TX signal is falling from 6V (the regulated positive output voltage 2Vsr) to 6V (the regulated negative output voltage −2Vsr), the discharging current I of the transmitter capacitor C is supplied by the negative output terminal $X_{-2}$, and thus the power consumption is 6*2*2I*C=24*I*C. Therefore, the total power consumption is 48*I*C, which corresponds to a high power consumption. The present invention wound like to reduce the total power consumption of the boost circuit.

Figure 2:
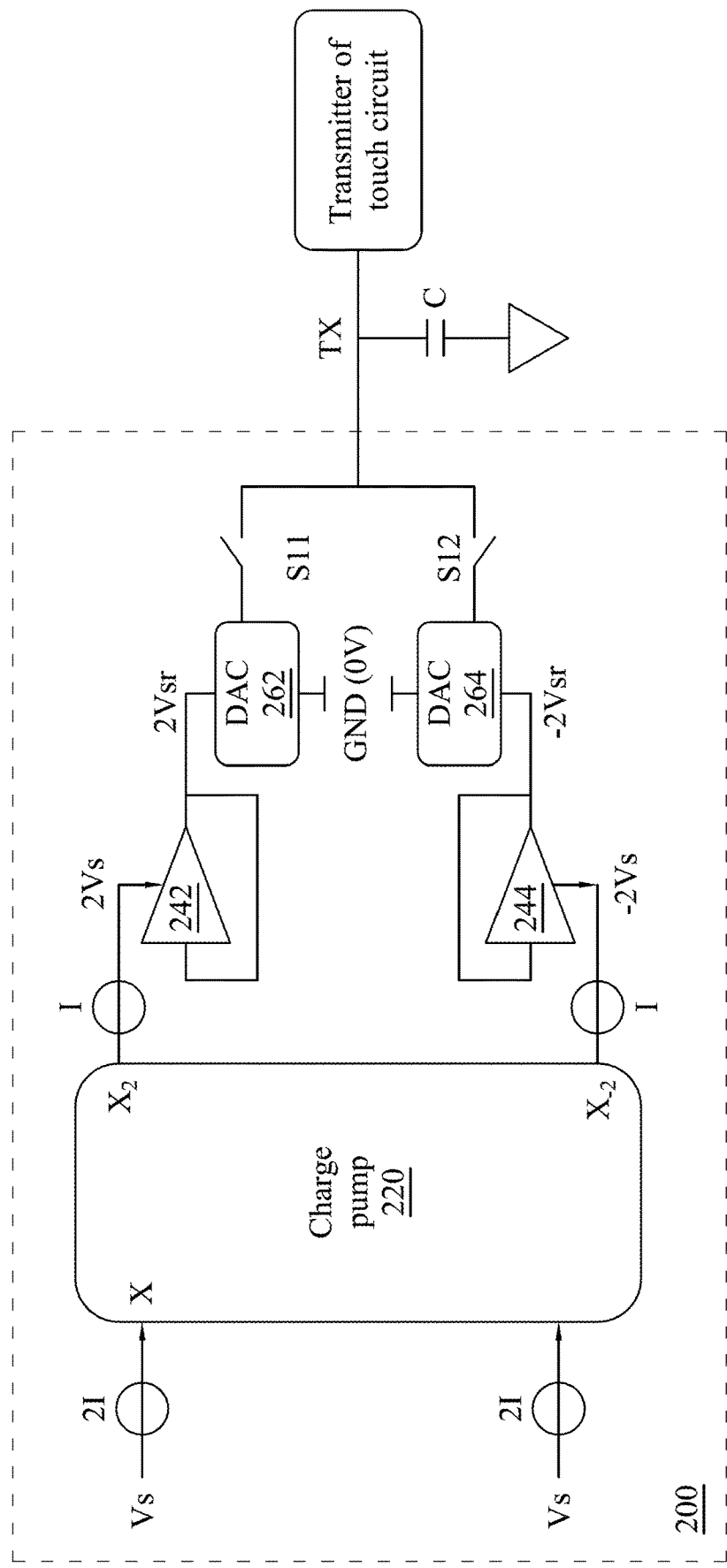
FIG. 2 illustrates a low power consumption boost circuit for providing high driving voltage of a touch circuit according to a first embodiment of the present invention.

FIG. 2 illustrates a low power consumption boost circuit 200 for providing high driving voltage of a touch circuit according to a first embodiment of the present invention. The low power consumption boost circuit 200 includes a charge pump circuit 220, a first LDO 242, a second LDO 244, a first DAC 262, a second DAC 264, a first switch S11, and a second switch S12. Specifically, in the first embodiment of the present invention, the touch circuit is alternately driven by two DACs by utilizing two switches to select which DAC the TX signal should be provided by.

The charge pump circuit 220 includes an input terminal X, a positive output terminal $X_2$, and a negative output terminal $X_{-2}$. The input terminal X receives a system voltage Vs (e.g., 3.3V). The positive output terminal $X_2$ outputs a positive output voltage 2Vs (e.g., 6.6V). The negative output terminal $X_{-2}$ outputs a negative output voltage −2Vs (e.g., −6.6V). Specifically, the charge pump circuit 220 receives the system voltage Vs and correspondingly outputs the positive output voltage 2Vs and the negative output voltage −2Vs. In other words, the positive and the negative output terminals respectively output the positive and the negative output voltages whose absolute voltage values have two times of the voltage values of the system voltage. The negative output terminal $X_{-2}$ outputs the negative output voltage −2Vs with opposite polarity as the system voltage Vs.

The first LDO 242 is connected between the first DAC 262 and the positive output terminal $X_2$ of the charge pump circuit 220. The first LDO 242 receives the positive output voltage 2Vs from the positive output terminal $X_2$ of the charge pump circuit 220 so as to regulate the positive output voltage 2Vs, thereby providing the regulated positive output voltage 2Vsr (e.g., 6V) to the first DAC 262 as the positive supply voltage of the first DAC 262. The second LDO 244 is connected between the second DAC 264 and the negative output terminal $X_{-2}$ of the charge pump circuit 220. The second LDO 244 receives the negative output voltage −2Vs from the negative output terminal $X_{-2}$ of the charge pump circuit 220 so as to regulate the negative output voltage −2Vs, thereby providing the regulated negative output voltage −2Vsr (e.g., −6V) to the second DAC 264 as the negative supply voltage of the second DAC 264.

The first DAC 262 and the second DAC 264 are used to generate the transmitter signal TX to the transmitter of the touch circuit, thereby driving the touch circuit. As shown in FIG. 2, the first DAC 262 is powered by the regulated positive output voltage 2Vsr and the ground voltage (i.e., 0V), and thus the TX signal generated by the first DAC 262 can be from the ground voltage (i.e., 0V) to the regulated positive output voltage 2Vsr. In other words, a ground terminal GND providing the ground voltage and the positive output terminal $X_2$ of the charge pump circuit 220 are connected to the first DAC 262 to supply power to the first DAC 262. In addition, the second DAC 264 is powered by the ground voltage (i.e., 0V) and the regulated negative output voltage −2Vsr, and thus the TX signal generated by the second DAC 264 can be from the regulated negative output voltage −2Vsr to the ground voltage (i.e., 0V). In other words, the ground terminal GND providing the ground voltage and the negative output terminal $X_{-2}$ of the charge pump circuit 220 are connected to the second DAC 264 to supply power to the second DAC 264.

Please note that the first LDO 242 and the second LDO 244 are optional for the present invention. In other words, the low power consumption boost circuit 200 may not include the first LDO 242 and the second LDO 244, and thus the first DAC 262 is directly connected to the positive output terminal $X_2$ of the charge pump circuit 220 to receive the positive output voltage 2Vs as the positive supply voltage of the first DAC 262, and the second DAC 264 is directly connected to the negative output terminal $X_{-2}$ of the charge pump circuit 220 to receive the negative output voltage −2Vs as the negative supply voltage of the second DAC 264. Specifically, the first DAC 262 provides voltage from the ground voltage to a first positive voltage, and the first positive voltage is equal to the regulated positive output voltage 2Vsr (e.g., 6V) (i.e., the first positive voltage is less than the positive output voltage) when the low power consumption boost circuit 200 includes the first LDO 242, and the first positive voltage is equal to the positive output voltage 2Vs (e.g., 6.6V) when the low power consumption boost circuit 200 does not include the first LDO 242. Specifically, the second DAC 264 provides voltage from a first negative voltage to the ground voltage, and the first negative voltage is equal to the regulated negative output voltage −2Vsr (e.g., −6V) (i.e., the first negative voltage is greater than the negative output voltage) when the low power consumption boost circuit 200 includes the second LDO 244, and the first negative voltage is equal to the negative output voltage −2Vs (e.g., −6.6V) when the low power consumption boost circuit 200 does not include the second LDO 244.

The first switch S11 is connected between the first DAC 262 and the transmitter of the touch circuit. The first DAC 262 is connected between the charge pump circuit 220 and the first switch S11. The second switch S12 is connected between the second DAC 264 and the transmitter of the touch circuit. The second DAC 264 is connected between the charge pump circuit 220 and the second switch S12. The first switch S11 and the second switch S12 are controlled to switch on alternately, such that the touch circuit is alternately driven by the first DAC 262 and the second DAC 264. In other words, the touch circuit is alternately driven through the first DAC 262 and the second DAC 264 by controlling the first switch S11 and the second switch S12 to switch on alternately.

Please note that the first switch S11 and the second switch S12 can be replaced by a switch circuit or a switch component with two input nodes and one output node, such as a single pole double throw (SPDT) switch or the like.

Figure 3:
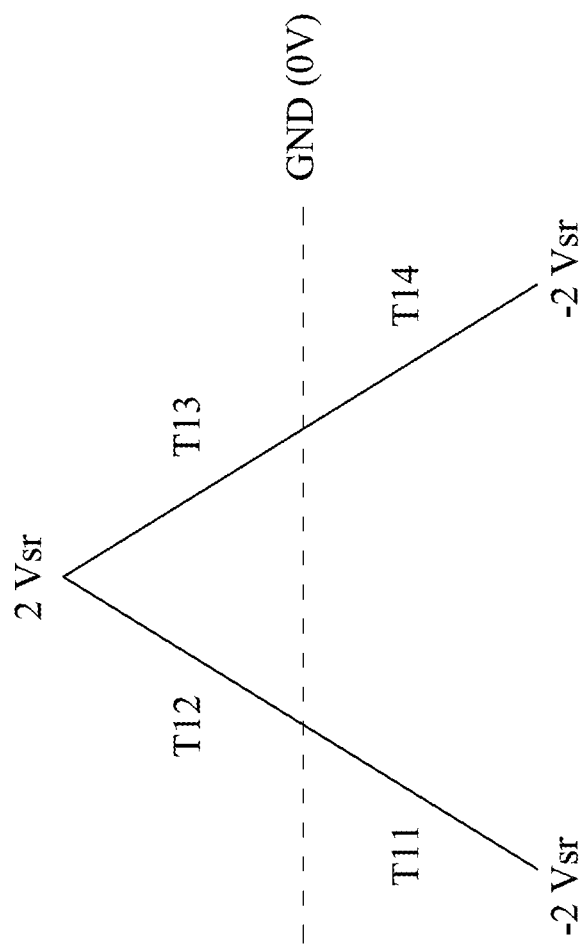
FIG. 3 illustrates a voltage change situation of the driven voltage of the TX signal according to the first embodiment of the present invention.

FIG. 3 illustrates a voltage change situation of the driven voltage of the TX signal according to the first embodiment of the present invention. At duration T11, when the touch circuit is driven and a driven voltage of the touch circuit is rising from the first negative voltage (e.g., the regulated negative output voltage −2Vsr as shown in FIG. 3) to the ground voltage, the second switch S12 is controlled to switch on and the first switch S11 is controlled to switch off, such that the touch circuit is powered by the ground voltage of the second DAC 264 with zero power consumption. In other words, during the duration T11, the transmitter capacitor C is charged by the ground voltage of the second DAC 264, and thus the system voltage Vs is not required to provide the current, and therefore the power consumption during the duration T11 is 0.

As shown in FIG. 3, at duration T12, when the touch circuit is driven and a driven voltage of the touch circuit is rising from the ground voltage to the first positive voltage (e.g., the regulated positive output voltage 2Vsr as shown in FIG. 3), the first switch S11 is controlled to switch on and the second switch S12 is controlled to switch off, such that the touch circuit is powered by the first positive voltage (e.g., the regulated positive output voltage 2Vsr) of the first DAC 262. In other words, during the duration T12, the charging current I of the transmitter capacitor C is supplied by the positive output terminal $X_2$ (i.e., the current I) through the first DAC 262, and the system voltage Vs is correspondingly required to provide the current 2I, and thus the power consumption during the duration T12 is 6*2I*C=12*I*C.

As shown in FIG. 3, at duration T13, when the touch circuit is driven and a driven voltage of the touch circuit is falling from the first positive voltage (e.g., the regulated positive output voltage 2Vsr as shown in FIG. 3) to the ground voltage, the first switch S11 is controlled to switch on and the second switch S12 is controlled to switch off, such that the touch circuit is powered by the ground voltage of the first DAC 262 with zero power consumption. In other words, during the duration T13, the transmitter capacitor C is charged by the ground voltage of the first DAC 262, and thus the system voltage Vs is not required to provide the current, and therefore the power consumption during the duration T13 is 0.

As shown in FIG. 3, at duration T14, when the touch circuit is driven and a driven voltage of the touch circuit is falling from the ground voltage to the first negative voltage (e.g., the regulated negative output voltage −2Vsr as shown in FIG. 3), the second switch S12 is controlled to switch on and the first switch S11 is controlled to switch off, such that the touch circuit is powered by the first negative voltage of the second DAC 264. In other words, during the duration T14, the discharging current I of the transmitter capacitor C is supplied by the negative output terminal $X_{-2}$ (i.e., the current I) through the second DAC 264, and the system voltage Vs is correspondingly required to provide the current 2I, and thus the power consumption during the duration T14 is 6*2I*C=12*I*C.

To sum up, regarding the FIG. 3, the total power consumption is 24*I*C. In comparison with the FIG. 1 of prior art, the first embodiment of the present invention reduces the power consumption from 48*I*C to 24*I*C. Therefore, the low power consumption boost circuit 200 of the first embodiment of the present invention can reduce power consumption.

Figure 4:
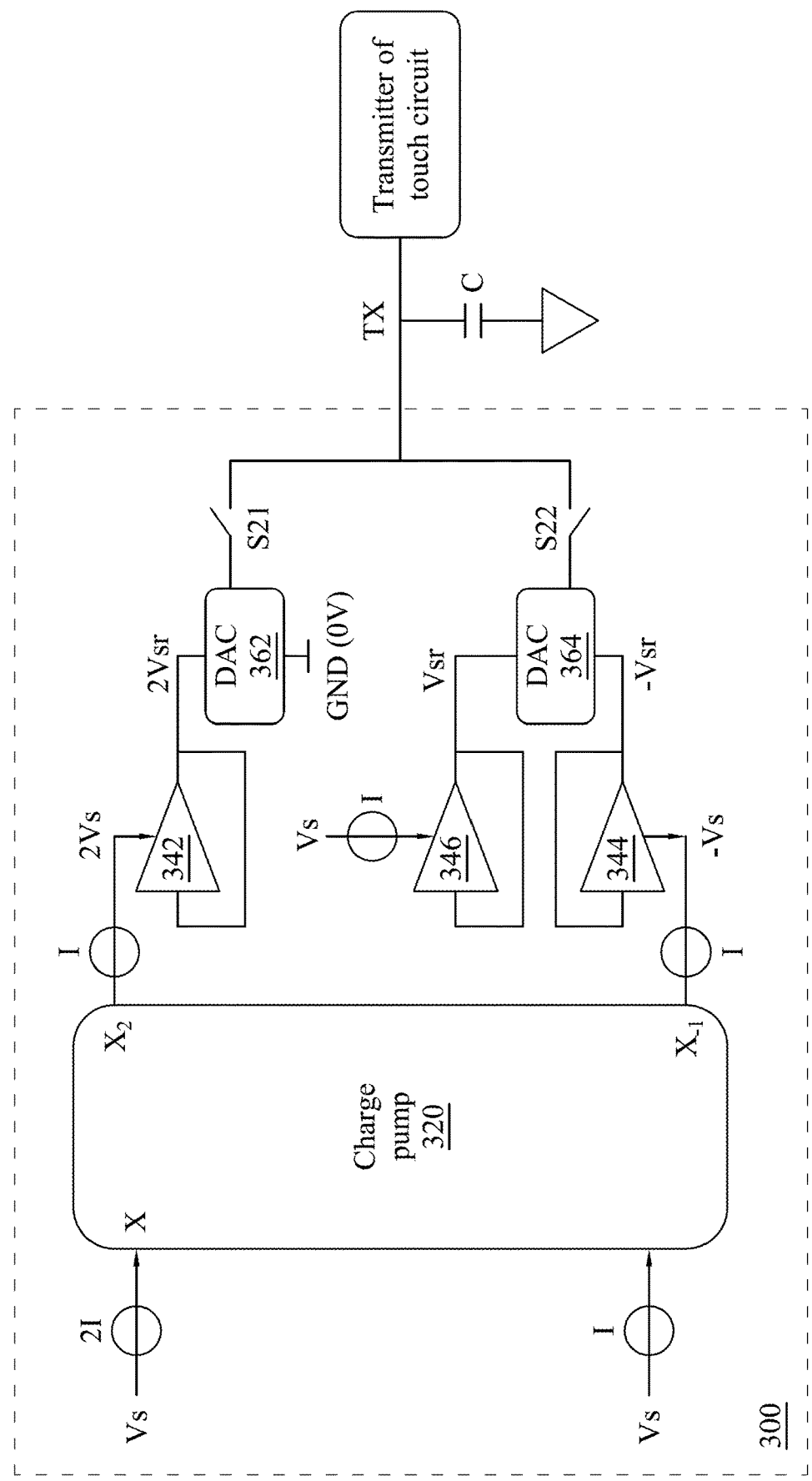
FIG. 4 illustrates a low power consumption boost circuit for providing high driving voltage of a touch circuit according to a second embodiment of the present invention.

FIG. 4 illustrates a low power consumption boost circuit 300 for providing high driving voltage of a touch circuit according to a second embodiment of the present invention. The low power consumption boost circuit 300 includes a charge pump circuit 320, a first LDO 342, a second LDO 344, a third LDO 346, a first DAC 362, a second DAC 364, a first switch S21, and a second switch S22. Specifically, in the second embodiment of the present invention, the touch circuit is alternately driven by two DACs by utilizing two switches to select which DAC the TX signal should be provided by.

The charge pump circuit 320 includes an input terminal X, a positive output terminal $X_2$, and a negative output terminal $X_{-1}$. The input terminal X receives a system voltage Vs (e.g., 3.3V). The positive output terminal $X_2$ outputs a positive output voltage 2Vs (e.g., 6.6V). The negative output terminal $X_{-1}$ outputs a negative output voltage −Vs (e.g., −3.3V). Specifically, the charge pump circuit 320 receives the system voltage Vs and correspondingly outputs a positive output voltage 2Vs and a negative output voltage −Vs. In other words, the positive output terminal $X_2$ outputs the positive output voltage 2Vs whose absolute voltage value has two times of the voltage values of the system voltage Vs, and the negative output terminal $X_{-1}$ outputs the negative output voltage −Vs whose absolute voltage value is equal to the voltage values of the system voltage Vs. The negative output terminal $X_{-1}$ outputs the negative output voltage −Vs with opposite polarity as the system voltage Vs.

The first LDO 342 is connected between the first DAC 362 and the positive output terminal $X_2$ of the charge pump circuit 320. The first LDO 342 receives the positive output voltage 2Vs from the positive output terminal $X_2$ of the charge pump circuit 320 so as to regulate the positive output voltage 2Vs, thereby providing the regulated positive output voltage 2Vsr (e.g., 6V) to the first DAC 362 as the positive supply voltage of the first DAC 362. The second LDO 344 is connected between the second DAC 364 and the negative output terminal $X_{-1}$ of the charge pump circuit 320. The second LDO 344 receives the negative output voltage −Vs from the negative output terminal $X_{-1}$ of the charge pump circuit 320 so as to regulate the negative output voltage −Vs, thereby providing the regulated negative output voltage −Vsr (e.g., −3V) to the second DAC 364 as the negative supply voltage of the second DAC 364. The third LDO 346 is connected between the second DAC 364 and the input terminal X of the charge pump circuit 320. The third LDO 346 receives the system voltage Vs from the input terminal X of the charge pump circuit 320 so as to regulate the system voltage Vs, thereby providing the regulated system voltage Vsr (e.g., 3V) to the second DAC 364 as the positive supply voltage of the second DAC 364.

The first DAC 362 and the second DAC 364 are used to generate the transmitter signal TX to the transmitter of the touch circuit, thereby driving the touch circuit. As shown in FIG. 4, the first DAC 362 is powered by the regulated positive output voltage 2Vsr and the ground voltage (i.e., 0V), and thus the TX signal generated by the first DAC 362 can be from the ground voltage (i.e., 0V) to the regulated positive output voltage 2Vsr. In other words, a ground terminal GND providing the ground voltage and the positive output terminal $X_2$ of the charge pump circuit 320 are connected to the first DAC 362 to supply power to the first DAC 362. In addition, the second DAC 364 is powered by the regulated system voltage Vsr and the regulated negative output voltage −Vsr, and thus the TX signal generated by the second DAC 364 can be from the regulated negative output voltage −Vsr to the regulated system voltage Vsr. In other words, the input terminal X and the negative output terminal $X_{-1}$ of the charge pump circuit 320 are connected to the second DAC 364 to supply power to the second DAC 364.

Please note that the first LDO 342, the second LDO 344, and the third LDO 346 are optional for the present invention. In other words, the low power consumption boost circuit 300 may not include the first LDO 342, the second LDO 344, and the third LDO 346, and thus the first DAC 362 is directly connected to the positive output terminal $X_2$ of the charge pump circuit 320 to receive the positive output voltage 2Vs as the positive supply voltage of the first DAC 362, and the second DAC 364 is directly connected to the negative output terminal $X_{-1}$ of the charge pump circuit 320 to receive the negative output voltage −Vs as the negative supply voltage of the second DAC 364 and directly receives the system voltage Vs as the positive supply voltage of the second DAC 364. Specifically, the first DAC 362 provides voltage from the ground voltage to a first positive voltage, and the first positive voltage is equal to the regulated positive output voltage 2Vsr (e.g., 6V) (i.e., the first positive voltage is less than the positive output voltage) when the low power consumption boost circuit 300 includes the first LDO 342, and the first positive voltage is equal to the positive output voltage 2Vs (e.g., 6.6V) when the low power consumption boost circuit 300 does not include the first LDO 342. Specifically, the second DAC 364 provides voltage from a second negative voltage to a second positive voltage, and the second negative voltage is equal to the regulated negative output voltage −Vsr (e.g., −3V) (i.e., the second negative voltage is greater than the negative output voltage) when the low power consumption boost circuit 300 includes the second LDO 344, and the second negative voltage is equal to the negative output voltage −Vs (e.g., −3.3V) when the low power consumption boost circuit 300 does not include the second LDO 344. Specifically, the second DAC 364 provides voltage from the second negative voltage to the second positive voltage, and the second positive voltage is equal to the regulated system voltage Vsr (e.g., 3V) (i.e., the second positive voltage is less than the system voltage) when the low power consumption boost circuit 300 includes the third LDO 346, and the second positive voltage is equal to the system voltage Vs (e.g., 3.3V) when the low power consumption boost circuit 300 does not include the third LDO 346. As discussed above, the first positive voltage is twice the second positive voltage.

The first switch S21 is connected between the first DAC 362 and the transmitter of the touch circuit. The first DAC 362 is connected between the charge pump circuit 320 and the first switch S21. The second switch S22 is connected between the second DAC 364 and the transmitter of the touch circuit. The second DAC 364 is connected between the charge pump circuit 320 and the second switch S22. The first switch S21 and the second switch S22 are controlled to switch on alternately, such that the touch circuit is alternately driven by the first DAC 362 and the second DAC 364. In other words, the touch circuit is alternately driven through the first DAC 362 and the second DAC 364 by controlling the first switch S21 and the second switch S22 to switch on alternately.

Please note that the first switch S21 and the second switch S22 can be replaced by a switch circuit or a switch component with two input nodes and one output node, such as a single pole double throw (SPDT) switch or the like.

Figure 5:
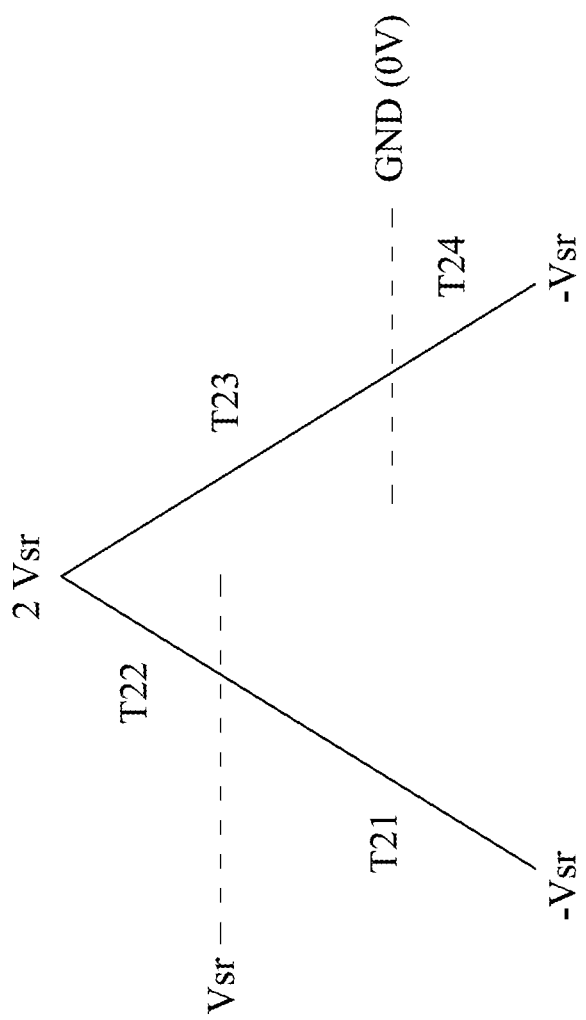
FIG. 5 illustrates a voltage change situation of the driven voltage of the TX signal according to the second embodiment of the present invention.

FIG. 5 illustrates a voltage change situation of the driven voltage of the TX signal according to the second embodiment of the present invention. At duration T21, when the touch circuit is driven and a driven voltage of the touch circuit is rising from the second negative voltage (e.g., the regulated negative output voltage −Vsr as shown in FIG. 5) to the second positive voltage (e.g., the regulated system voltage Vsr as shown in FIG. 5), the second switch S22 is controlled to switch on and the first switch S21 is controlled to switch off, such that the touch circuit is powered by the second positive voltage (e.g., the regulated system voltage Vsr) of the second DAC 364. In other words, during the duration T21, the charging current I of the transmitter capacitor C is supplied by the system voltage Vs through the second DAC 364, and the system voltage Vs is correspondingly required to provide the current I, and thus the power consumption during the duration T21 is 3*2*I*C=6*I*C.

As shown in FIG. 5, at duration T22, when the touch circuit is driven and a driven voltage of the touch circuit is rising from the second positive voltage (e.g., the regulated system voltage Vsr as shown in FIG. 5) to the first positive voltage (e.g., the regulated positive output voltage 2Vsr as shown in FIG. 5), the first switch S21 is controlled to switch on and the second switch S22 is controlled to switch off, such that the touch circuit is powered by the first positive voltage (e.g., the regulated positive output voltage 2Vsr) of the first DAC 362. In other words, during the duration T22, the charging current I of the transmitter capacitor C is supplied by the positive output terminal $X_2$ (i.e., the current I) through the first DAC 362, and the system voltage Vs is correspondingly required to provide the current 2I, and thus the power consumption during the duration T22 is 3*2I*C=6*I*C.

As shown in FIG. 5, at duration T23, when the touch circuit is driven and a driven voltage of the touch circuit is falling from the first positive voltage (e.g., the regulated positive output voltage 2Vsr as shown in FIG. 5) to the ground voltage, the first switch S21 is controlled to switch on and the second switch S22 is controlled to switch off, such that the touch circuit is powered by the ground voltage of the first DAC 362 with zero power consumption. In other words, during the duration T23, the transmitter capacitor C is charged by the ground voltage of the first DAC 362, and thus the system voltage Vs is not required to provide the current, and therefore the power consumption during the duration T23 is 0.

As shown in FIG. 5, at duration T24, when the touch circuit is driven and a driven voltage of the touch circuit is falling from the ground voltage to the second negative voltage (e.g., the regulated negative output voltage −Vsr as shown in FIG. 5), the second switch S22 is controlled to switch on and the first switch S21 is controlled to switch off, such that the touch circuit is powered by the second negative voltage (e.g., the regulated negative output voltage −Vsr) of the second DAC 364. In other words, during the duration T24, the discharging current I of the transmitter capacitor C is supplied by the negative output terminal $X_{-1}$ (i.e., the current I) through the second DAC 364, and the system voltage Vs is correspondingly required to provide the current I, and thus the power consumption during the duration T24 is 3*I*C.

To sum up, regarding the FIG. 5, the total power consumption is 15*I*C. In comparison with the FIG. 3 of the first embodiment of the present invention, the second embodiment of the present invention reduces the power consumption from 24*I*C to 15*I*C and also reduces the driving voltage range from 12V to 9V. Therefore, although the driving voltage range is only 0.75 times that of the first embodiment, the total power consumption is only 0.625 times that of the first embodiment, so it will still save power in comparison with the first embodiment. Accordingly, the low power consumption boost circuit 300 of the second embodiment of the present invention can reduce power consumption.

Figure 6:
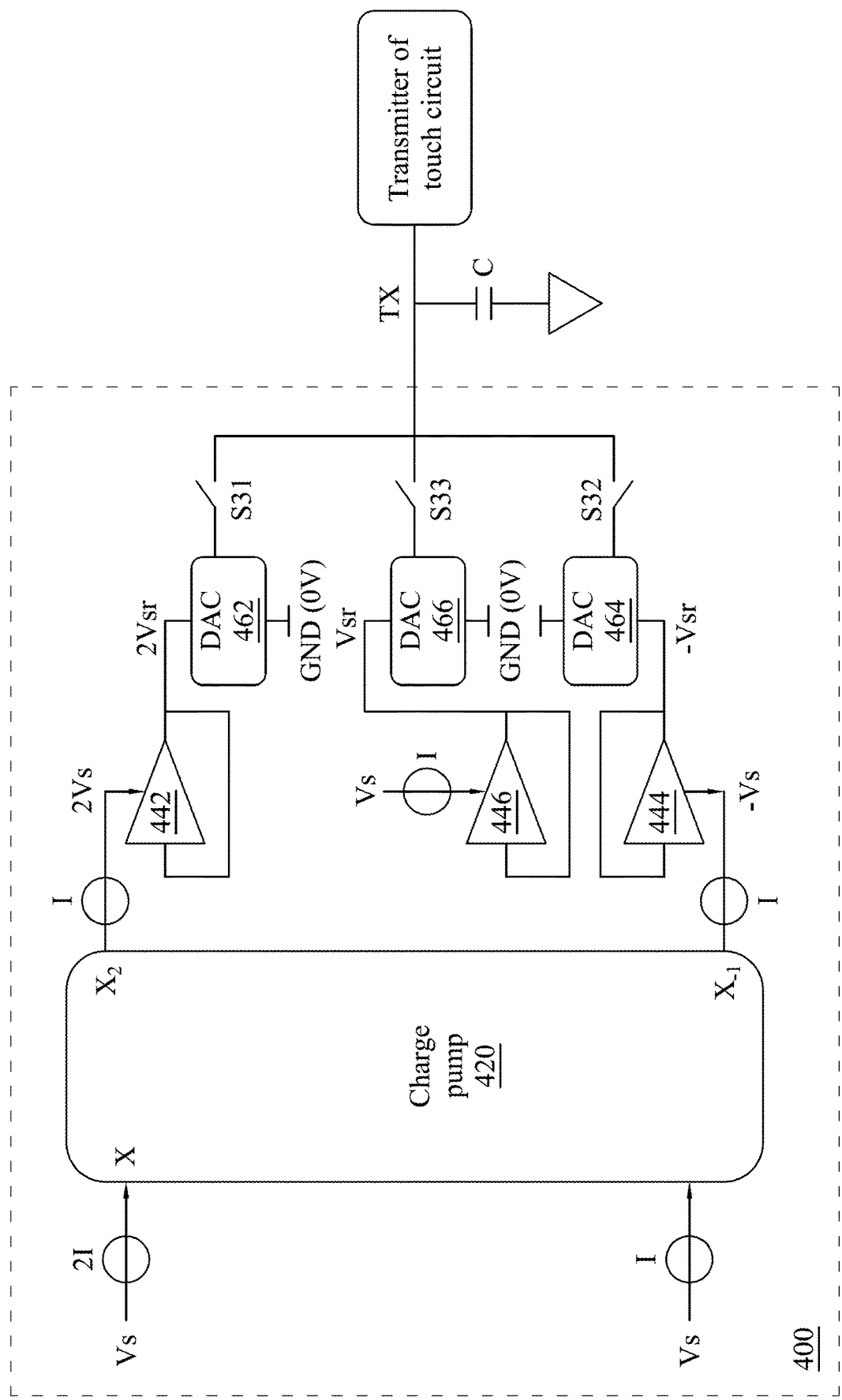
FIG. 6 illustrates a low power consumption boost circuit for providing high driving voltage of a touch circuit according to a third embodiment of the present invention.

FIG. 6 illustrates a low power consumption boost circuit 400 for providing high driving voltage of a touch circuit according to a third embodiment of the present invention. The low power consumption boost circuit 400 includes a charge pump circuit 420, a first LDO 442, a second LDO 444, a third LDO 446, a first DAC 462, a second DAC 464, a third DAC 466, a first switch S31, a second switch S32, and a third switch S33. Specifically, in the third embodiment of the present invention, the touch circuit is alternately driven by three DACs by utilizing three switches to select which DAC the TX signal should be provided by.

The charge pump circuit 420 includes an input terminal X, a positive output terminal $X_2$, and a negative output terminal $X_{-1}$. The input terminal X receives a system voltage Vs (e.g., 3.3V). The positive output terminal $X_2$ outputs a positive output voltage 2Vs (e.g., 6.6V). The negative output terminal $X_{-1}$ outputs a negative output voltage −Vs (e.g., −3.3V). Specifically, the charge pump circuit 420 receives the system voltage Vs and correspondingly outputs a positive output voltage 2Vs and a negative output voltage −Vs. In other words, the positive output terminal $X_2$ outputs the positive output voltage 2Vs whose absolute voltage value has two times of the voltage values of the system voltage Vs, and the negative output terminal $X_{-1}$ outputs the negative output voltage −Vs whose absolute voltage value is equal to the voltage values of the system voltage Vs. The negative output terminal $X_{-1}$ outputs the negative output voltage −Vs with opposite polarity as the system voltage Vs.

The first LDO 442 is connected between the first DAC 462 and the positive output terminal $X_2$ of the charge pump circuit 420. The first LDO 442 receives the positive output voltage 2Vs from the positive output terminal $X_2$ of the charge pump circuit 420 so as to regulate the positive output voltage 2Vs, thereby providing the regulated positive output voltage 2Vsr (e.g., 6V) to the first DAC 462 as the positive supply voltage of the first DAC 462. The second LDO 444 is connected between the second DAC 464 and the negative output terminal $X_{-1}$ of the charge pump circuit 420. The second LDO 444 receives the negative output voltage −Vs from the negative output terminal $X_{-1}$ of the charge pump circuit 420 so as to regulate the negative output voltage −Vs, thereby providing the regulated negative output voltage −Vsr (e.g., −3V) to the second DAC 464 as the negative supply voltage of the second DAC 464. The third LDO 446 is connected between the second DAC 464 and the input terminal X of the charge pump circuit 420. The third LDO 446 receives the system voltage Vs from the input terminal X of the charge pump circuit 420 so as to regulate the system voltage Vs, thereby providing the regulated system voltage Vsr (e.g., 3V) to the third DAC 466 as the positive supply voltage of the third DAC 466.

The first DAC 462, the second DAC 464, and the third DAC 466 are used to generate the transmitter signal TX to the transmitter of the touch circuit, thereby driving the touch circuit. As shown in FIG. 6, the first DAC 462 is powered by the regulated positive output voltage 2Vsr and the ground voltage (i.e., 0V), and thus the TX signal generated by the first DAC 462 can be from the ground voltage (i.e., 0V) to the regulated positive output voltage 2Vsr. In other words, a ground terminal GND providing the ground voltage and the positive output terminal $X_2$ of the charge pump circuit 420 are connected to the first DAC 462 to supply power to the first DAC 462. In addition, the second DAC 464 is powered by the ground voltage (i.e., 0V) and the regulated negative output voltage −Vsr, and thus the TX signal generated by the second DAC 464 can be from the regulated negative output voltage −Vsr to the ground voltage (i.e., 0V). In other words, the ground terminal GND providing the ground voltage and the negative output terminal $X_{-1}$ of the charge pump circuit 420 are connected to the second DAC 464 to supply power to the second DAC 464. In addition, the third DAC 466 is powered by the regulated positive output voltage Vsr and the ground voltage (i.e., 0V), and thus the TX signal generated by the third DAC 466 can be from the ground voltage (i.e., 0V) to the regulated negative output voltage −Vsr. In other words, the ground terminal GND providing the ground voltage and the input terminal X of the charge pump circuit 420 are connected to the third DAC 466 to supply power to the third DAC 466.

Please note that the first LDO 442, the second LDO 444, and the third LDO 446 are optional for the present invention. In other words, the low power consumption boost circuit 400 may not include the first LDO 442, the second LDO 444, and the third LDO 446, and thus the first DAC 462 is directly connected to the positive output terminal $X_2$ of the charge pump circuit 420 to receive the positive output voltage 2Vs as the positive supply voltage of the first DAC 462, and the second DAC 464 is directly connected to the negative output terminal $X_{-1}$ of the charge pump circuit 420 to receive the negative output voltage −Vs as the negative supply voltage of the second DAC 464, and the third DAC 466 directly receives the system voltage Vs as the positive supply voltage of the third DAC 466. Specifically, the first DAC 462 provides voltage from the ground voltage to a first positive voltage, and the first positive voltage is equal to the regulated positive output voltage 2Vsr (e.g., 6V) (i.e., the first positive voltage is less than the positive output voltage) when the low power consumption boost circuit 400 includes the first LDO 442, and the first positive voltage is equal to the positive output voltage 2Vs (e.g., 6.6V) when the low power consumption boost circuit 400 does not include the first LDO 442. Specifically, the second DAC 464 provides voltage from a second negative voltage to the ground voltage, and the second negative voltage is equal to the regulated negative output voltage −Vsr (e.g., −3V) (i.e., the second negative voltage is greater than the negative output voltage) when the low power consumption boost circuit 400 includes the second LDO 444, and the second negative voltage is equal to the negative output voltage −Vs (e.g., −3.3V) when the low power consumption boost circuit 400 does not include the second LDO 444. Specifically, the third DAC 466 provides voltage from the ground voltage to the second positive voltage, and the second positive voltage is equal to the regulated system voltage Vsr (e.g., 3V) (i.e., the second positive voltage is less than the system voltage) when the low power consumption boost circuit 400 includes the third LDO 446, and the second positive voltage is equal to the system voltage Vs (e.g., 3.3V) when the low power consumption boost circuit 400 does not include the third LDO 446. As discussed above, the first voltage is twice the second positive voltage.

The first switch S31 is connected between the first DAC 462 and the transmitter of the touch circuit. The first DAC 462 is connected between the charge pump circuit 420 and the first switch S31. The second switch S32 is connected between the second DAC 464 and the transmitter of the touch circuit. The second DAC 464 is connected between the charge pump circuit 420 and the second switch S32. The third switch S33 is connected between the third DAC 466 and the transmitter of the touch circuit. The third DAC 466 is connected between the input terminal X and the third switch S33. The first switch S31, the second switch S32, and the third switch S33 are controlled to switch on alternately, such that the touch circuit is alternately driven by the first DAC 462, the second DAC 464 and the third DAC 466. In other words, the touch circuit is alternately driven through the first DAC 462, the second DAC 464 and the third DAC 466 by controlling the first switch S31, the second switch S32, and the third switch S32 to switch on alternately.

Please note that the first switch S31, the second switch S32, and the third switch S33 can be replaced by a switch circuit or a switch component with three input nodes and one output node, such as a single pole triple throw (SP3T) switch or the like.

Figure 7:
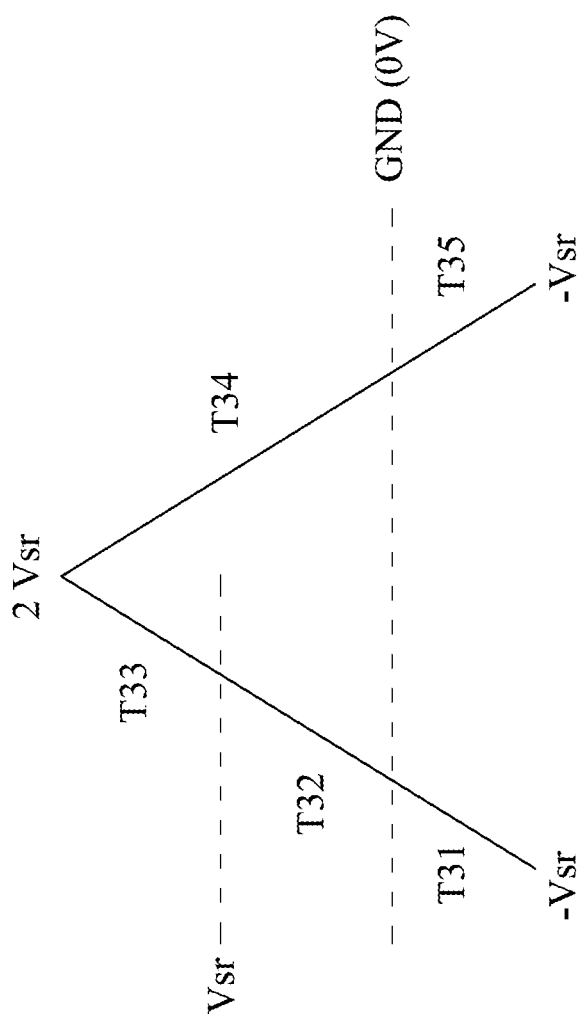
FIG. 7 illustrates a voltage change situation of the driven voltage of the TX signal according to the third embodiment of the present invention.

FIG. 7 illustrates a voltage change situation of the driven voltage of the TX signal according to the third embodiment of the present invention. At duration T31, when the touch circuit is driven and a driven voltage of the touch circuit is rising from the second negative voltage (e.g., the regulated negative output voltage −Vsr as shown in FIG. 7) to the ground voltage (i.e., 0V), the second switch S32 is controlled to switch on and the first switch S31 and the third switch S33 are controlled to switch off, such that the touch circuit is powered by the ground voltage of the second DAC 464 with zero power consumption. In other words, during the duration T31, the transmitter capacitor C is charged by the ground voltage of the second DAC 464, and thus the system voltage Vs is not required to provide the current, and therefore the power consumption during the duration T31 is 0.

As shown in FIG. 7, at duration T32, when the touch circuit is driven and a driven voltage of the touch circuit is rising from the ground voltage (i.e., 0V) to the second positive voltage (e.g., the regulated system voltage Vsr as shown in FIG. 7), the third switch S33 is controlled to switch on and the first switch S31 and the second switch are controlled to switch off, such that the touch circuit is powered by the second positive voltage (e.g., the regulated system voltage Vsr) of the third DAC 466. In other words, during the duration T32, the charging current I of the transmitter capacitor C is supplied by system voltage Vs through the third DAC 466, and the system voltage Vs is correspondingly required to provide the current I, and thus the power consumption during the duration T32 is 3*I*C.

As shown in FIG. 7, at duration T33, when the touch circuit is driven and a driven voltage of the touch circuit is rising from the second positive voltage (e.g., the regulated system voltage Vsr as shown in FIG. 7) to the first positive voltage (e.g., the regulated positive output voltage 2Vsr as shown in FIG. 7), the first switch S31 is controlled to switch on and the second switch S32 and the third switch S33 are controlled to switch off, such that the touch circuit is powered by the first positive voltage (e.g., the regulated positive output voltage 2Vsr) of the first DAC 462. In other words, during the duration T33, the charging current I of the transmitter capacitor C is supplied by the positive output terminal $X_2$ (i.e., the current I) through the first DAC 462, and the system voltage Vs is correspondingly required to provide the current 2I, and thus the power consumption during the duration T33 is 3*2I*C=6*I*C.

As shown in FIG. 7, at duration T34, when the touch circuit is driven and a driven voltage of the touch circuit is falling from the first positive voltage (e.g., the regulated positive output voltage 2Vsr as shown in FIG. 7) to the ground voltage, the first switch S31 is controlled to switch on and the second switch S32 and the third switch S33 are controlled to switch off, such that the touch circuit is powered by the ground voltage of the first DAC 462 with zero power consumption. In other words, during the duration T34, the transmitter capacitor C is charged by the ground voltage of the first DAC 462, and thus the system voltage Vs is not required to provide the current, and therefore the power consumption during the duration T34 is 0.

As shown in FIG. 7, at duration T35, when the touch circuit is driven and a driven voltage of the touch circuit is falling from the ground voltage to the second positive voltage (e.g., the regulated negative output voltage −Vsr as shown in FIG. 7), the second switch S32 is controlled to switch on and the first switch S31 and the third switch S33 are controlled to switch off, such that the touch circuit is powered by the second positive voltage (e.g., the regulated negative output voltage −Vsr) of the second DAC 464. In other words, during the duration T35, the discharging current I of the transmitter capacitor C is supplied by the negative output terminal $X_{-1}$ (i.e., the current I) through the second DAC 464, and the system voltage Vs is correspondingly required to provide the current I, and thus the power consumption during the duration T35 is 3*I*C.

To sum up, regarding the FIG. 7, the total power consumption is 12*I*C. In comparison with the FIG. 4 of the second embodiment of the present invention, the third embodiment of the present invention reduces the power consumption from 15*I*C to 12*I*C. Accordingly, the low power consumption boost circuit 400 of the third embodiment of the present invention can reduce power consumption.

Specifically, the low power consumption boost circuit of the present invention includes two or three DACs which are alternately connected to the touch circuit for alternately driving the touch circuit so as to realize multi-stage charging of the driven voltage of the driving voltage in the touch circuit and to achieve high voltage drive and reduce power consumption.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A low power consumption boost circuit for providing high driving voltage of a touch circuit, comprising:
    a charge pump circuit comprising:
        an input terminal receiving a system voltage;
        a positive output terminal outputting a positive output voltage twice the system voltage; and
        a negative output terminal outputting a negative output voltage with opposite polarity as the system voltage;
    a first digital-to-analog converter (DAC), wherein the positive output terminal and a ground terminal are connected to the first DAC to supply power to the first DAC;
    a second DAC, wherein the negative output terminal is connected to the second DAC to supply power to the second DAC;
    a first switch connected between the first DAC and the touch circuit, wherein the first DAC is connected between the charge pump circuit and the first switch; and
    a second switch connected between the second DAC and the touch circuit, wherein the second DAC is connected between the charge pump circuit and the second switch;
    wherein the touch circuit is alternately driven through the first DAC and the second DAC by controlling the first switch and the second switch to switch on alternately;
    wherein the first switch and the second switch are utilized such that one of the first DAC and the second DAC is selected to be connected to the touch circuit for driving the touch circuit.

2. The low power consumption boost circuit of claim 1, further comprising:
    a first low dropout regulator (LDO) connected between the first DAC and the positive output terminal, wherein the first LDO receives the positive output voltage from the positive output terminal to regulate the positive output voltage, thereby providing the regulated positive output voltage to the first DAC as supply power; and
    a second LDO connected between the second DAC and the negative output terminal, wherein the second LDO receives the negative output voltage from the negative output terminal to regulate the negative output voltage, thereby providing the regulated negative output voltage to the second DAC as supply power.

3. The low power consumption boost circuit of claim 2, further comprising:
    a third LDO connected to the second DAC, wherein the third LDO receives the system voltage to regulate the system voltage, thereby providing the regulated system voltage to the second DAC as supply power.

4. The low power consumption boost circuit of claim 1, wherein the negative output terminal and the ground terminal are connected to the second DAC to supply power to the second DAC, wherein an absolute value of the negative output voltage is equal to an absolute value of the positive output voltage, wherein the first DAC provides voltage from a ground voltage to a first positive voltage, wherein the second DAC provides voltage from a first negative voltage to the ground voltage, wherein the first positive voltage is equal to or less than the positive output voltage, wherein the first negative voltage is equal to or greater than the negative output voltage.

5. The low power consumption boost circuit of claim 4, wherein when the touch circuit is driven from the first negative voltage to the ground voltage, the second switch is controlled to switch on and the first switch is controlled to switch off, such that the touch circuit is powered by the ground voltage of the second DAC with zero power consumption.

6. The low power consumption boost circuit of claim 4, wherein when the touch circuit is driven from the ground voltage to the first positive voltage, the first switch is controlled to switch on and the second switch is controlled to switch off, such that the touch circuit is powered by the first positive voltage of the first DAC.

7. The low power consumption boost circuit of claim 4, wherein when the touch circuit is driven from the first positive voltage to the ground voltage, the first switch is controlled to switch on and the second switch is controlled to switch off, such that the touch circuit is powered by the ground voltage of the first DAC with zero power consumption.

8. The low power consumption boost circuit of claim 4, wherein when the touch circuit is driven from the ground voltage to the first negative voltage, the second switch is controlled to switch on and the first switch is controlled to switch off, such that the touch circuit is powered by the first negative voltage of the second DAC.

9. The low power consumption boost circuit of claim 1, wherein the input terminal and the negative output terminal are connected to the second DAC to supply power to the second DAC, wherein an absolute value of the negative output voltage is equal to an absolute value of the system voltage, wherein the first DAC provides voltage from a ground voltage to a first positive voltage, wherein the second DAC provides voltage from a second negative voltage to a second positive voltage, wherein the first positive voltage is twice the second positive voltage, wherein the first positive voltage is equal to or less than the positive output voltage, wherein the second positive voltage is equal to or less than the system voltage, wherein the second negative voltage is equal to or greater than the negative output voltage.

10. The low power consumption boost circuit of claim 9, wherein when the touch circuit is driven from the second negative voltage to the second positive voltage, the second switch is controlled to switch on and the first switch is controlled to switch off, such that the touch circuit is powered by the second positive voltage provided by the second DAC.

11. The low power consumption boost circuit of claim 9, wherein when the touch circuit is driven from the second positive voltage to the first positive voltage, the first switch is controlled to switch on and the second switch is controlled to switch off, such that the touch circuit is powered by the first positive voltage provided by the first DAC.

12. The low power consumption boost circuit of claim 9, wherein when the touch circuit is driven from the first positive voltage to the ground voltage, the first switch is controlled to switch on and the second switch is controlled to switch off, such that the touch circuit is powered by the ground voltage provided by the first DAC with zero power consumption.

13. The low power consumption boost circuit of claim 9, wherein when the touch circuit is driven from the ground voltage to the second negative voltage, the second switch is controlled to switch on and the first switch is controlled to switch off, such that the touch circuit is powered by the second negative voltage provided by the second DAC.

14. The low power consumption boost circuit of claim 1, further comprising:
   a third DAC, wherein the input terminal and the ground terminal are connected to the third DAC to supply power to the third DAC, wherein the ground terminal and the negative output terminal are connected to the second DAC to supply power to the second DAC, wherein an absolute value of the negative output voltage is equal to an absolute value of the system voltage; and
   a third switch connected between the third DAC and the touch circuit, wherein the third DAC is connected between the charge pump circuit and the third switch;
   wherein the touch circuit is alternately driven through the first DAC, the second DAC and the third DAC by controlling the first switch, the second switch and the third switch to switch on alternately.

15. The low power consumption boost circuit of claim 14, wherein the first DAC provides voltage from a ground voltage to a first positive voltage, wherein the second DAC provides voltage from a second negative voltage to the ground voltage, wherein the third DAC provides voltage from the ground voltage to a second positive voltage, wherein the first positive voltage is twice the second positive voltage, wherein the first positive voltage is equal to or less than the positive output voltage, wherein the second positive voltage is equal to or less than the system voltage, wherein the second negative voltage is equal to or greater than the negative output voltage.

16. The low power consumption boost circuit of claim 15, wherein when the touch circuit is driven from the second negative voltage to the ground voltage, the second switch is controlled to switch on and the first switch and the third switch are controlled to switch off, such that the touch circuit is powered by the ground voltage provided by the second DAC with zero power consumption.

17. The low power consumption boost circuit of claim 15, wherein when the touch circuit is driven from the ground voltage to the second positive voltage, the third switch is controlled to switch on and the first switch and the second switch are controlled to switch off, such that the touch circuit is powered by the second positive voltage provided by the third DAC.

18. The low power consumption boost circuit of claim 15, wherein when the touch circuit is driven from the second positive voltage to the first positive voltage, the first switch is controlled to switch on and the second switch and the third switch are controlled to switch off, such that the touch circuit is powered by the first positive voltage provided by the first DAC.

19. The low power consumption boost circuit of claim 15,
   wherein when the touch circuit is driven from the first positive voltage to the ground voltage, the first switch is controlled to switch on and the second switch and the third switch are controlled to switch off, such that the touch circuit is powered by the ground voltage provided by the first DAC with zero power consumption;
   wherein when the touch circuit is driven from the ground voltage to the second negative voltage, the second switch is controlled to switch on and the first switch and the third switch are controlled to switch off, such that the touch circuit is powered by the second negative voltage provided by the second DAC.

20. A low power consumption boost circuit for providing high driving voltage of a touch circuit, comprising:
   a charge pump circuit receiving a system voltage and correspondingly outputting a positive output voltage twice the system voltage and a negative output voltage with opposite polarity as the system voltage;
   two digital-to-analog converters (DACs) connected to the charge pump circuit, wherein one of the DACs receives the positive output voltage from the charge pump circuit as supply voltage, and the other DAC receives the negative output voltage from the charge pump circuit as supply voltage; and
   a switch circuit connected between the DACs and the touch circuit, wherein the DACs are connected between the charge pump circuit and the switch circuit;
   wherein the DACs are alternately connected to the touch circuit by controlling the switch circuit, thereby driving the touch circuit alternately;
   wherein the first switch and the second switch are utilized such that one of the first DAC and the second DAC is selected to be connected to the touch circuit for driving the touch circuit.

* * * * *